(12) United States Patent
Sekihara

(10) Patent No.: US 8,435,703 B2
(45) Date of Patent: May 7, 2013

(54) PELLICLE

(75) Inventor: Kazutoshi Sekihara, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 457 days.

(21) Appl. No.: 12/801,815

(22) Filed: Jun. 28, 2010

(65) Prior Publication Data

US 2010/0328635 A1   Dec. 30, 2010

(30) Foreign Application Priority Data

Jun. 26, 2009   (JP) ................................. 2009-152277

(51) Int. Cl.
   *G03F 1/62*   (2012.01)
   *G03F 1/64*   (2012.01)
(52) U.S. Cl.
   USPC ............................................................. 430/5
(58) Field of Classification Search ........................ 430/5
   See application file for complete search history.

(56) References Cited

U.S. PATENT DOCUMENTS

2006/0246234 A1   11/2006   Meyers et al.
2007/0037067 A1    2/2007   Wang
2007/0127000 A1    6/2007   Laganza et al.

FOREIGN PATENT DOCUMENTS

EP   0 696 760   2/1996
JP   2005-250188   9/2005

*Primary Examiner* — Christopher Young
(74) *Attorney, Agent, or Firm* — Manabu Kanesaka

(57) ABSTRACT

There is provided a pellicle having a rectangular pellicle frame formed of four side bars, having a through hole made through at least one of the frame bars for adjusting a pressure of a space formed within the pellicle frame equal to a pressure outside the pellicle frame; and a filter member disposed to cover up an external opening of the through hole for preventing entrance of particles into the space, wherein the through hole is formed with:

(1) an outer stepped portion defining a first recess, opening outside the pellicle frame, for accommodating the filter member,
(2) an inner stepped portion defining a second recess, opening in a bottom of the first recess, and
(3) a ventilation hole with one end opening in a bottom of the second recess of the inner stepped portion and the other end opening in the space within the pellicle frame.

11 Claims, 7 Drawing Sheets

F I G. 4 A
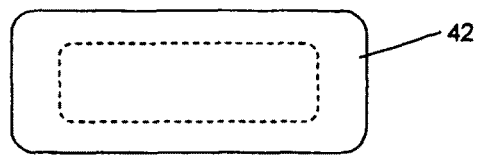
F I G. 4 B
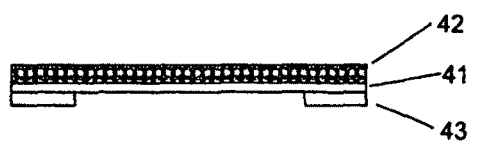
F I G. 4 C
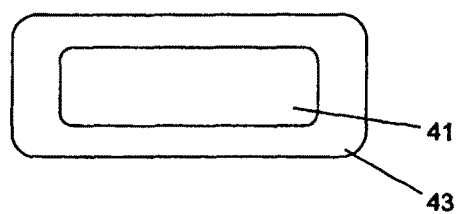

:# PELLICLE

RELATED APPLICATIONS

The present application is claims priority from Japanese Application No. 2009-152277, filed Jun. 26, 2009, the disclosure of which is hereby incorporated by reference herein in its entirety.

FIELD OF THE INVENTION

The present invention relates to a pellicle used as a dustproof when a semiconductor device, a printed circuit board, a liquid crystal display and the like are manufactured.

BACKGROUND

In manufacture of a semiconductor including LSI, super LSI and the like or in manufacture of a liquid crystal display or the like, a pattern is made by irradiating light to a semiconductor wafer or an original plate for liquid crystal, but if a dust adheres to a photomask or a reticle (hereinafter simply referred to as a photomask in short) used at this time, the dust absorbs light or refracts the light, which causes deformation of a transferred pattern, rough edges or black stains on a base and leads to a problem that dimensions, quality, appearance and the like are damaged.

Thus, these works are usually performed in a clean room, but it is still difficult to keep the photomask clean all the time. Therefore, a pellicle is attached to the surface of the photomask as a dustproof and then, exposure is carried out. In this case, foreign substances do not directly adhere to the surface of the photomask but to the pellicle, and by setting a focus on a pattern of the photomask in lithography, the foreign substances on the pellicle no longer become a concern to the transfer.

A pellicle has a transparent pellicle film attached on an upper end face of a pellicle frame. A material of the pellicle film includes cellulose nitrate, cellulose acetate, fluorine contained resin or the like, which transmits light well, and a material of the pellicle frame includes aluminum, stainless, polyethylene and the like. Moreover, a pressure-sensitive adhesive layer made of polybutene resin, polyvinyl acetate resin, acrylic resin and the like to be attached to the photomask and a separation layer (separator) intended to protect the pressure-sensitive adhesive layer are disposed at a lower end of the pellicle frame in general.

Also, in a state in which the pellicle is attached to the photomask, with the purpose of eliminating a pressure difference between a space contained inside the pellicle and the outside, one or more ventilation hole for adjusting pressure is bored through pellicle frame bar(s), and a filter member is installed in order to prevent foreign substances from the atmosphere from moving in and through the ventilation hole in some cases (See Japanese Utility Model Registration Application Publication No. S63-39703).

With regard to this filter member, a trapping diameter and an area are usually considered so that desired foreign-substance trapping performances and ventilation performances are obtained, but if a desired ventilation amount cannot be obtained with one ventilation hole for atmospheric pressure control, a plurality of ventilation holes are provided and a filter member is installed in each. Particularly, in the case of a large-sized pellicle for liquid crystal manufacture such as those having a side exceeding 500 mm, eight to several tens of ventilation holes are usually provided and a filter member is installed in each in order to ensure the ventilation amount.

However, to provide a large number of ventilation holes in order to ensure the ventilation amount results in deterioration of rigidity of the pellicle frame, which is not preferable. If the rigidity is lowered, deformation can easily occur during manufacture, deflection of the frame when the pellicle film is extended becomes large, which leads to a problem that an effective exposure area inside the pellicle is reduced or accuracy of pellicle attachment is deteriorated.

As the filter member used here, a sheet-shaped one in which a porous thin film obtained by stretching and working polytetrafluoroethylene (PTFE) or the like is used as a filter film is suitable for use in the pellicle in general in terms of cost and the shape and often used. The structure is a three-layered structure as shown in FIG. 4B, in which a pressure-sensitive adhesive layer 43 to be bonded to a pellicle frame is arranged in a ring shape on one face of a filter film 41, and a rough mesh-state protective mesh 42 made of polypropylene (PP) or the like in order to protect the filter film 41 is bonded to the opposite face, and its entire thickness is approximately 0.15 to 0.3 mm. FIG. 4A is a plan view, FIG. 4B is a front view, and FIG. 4C is a bottom view of an example of a filter member. A work of applying an adhesive substance to the filter film or infiltrating the pressure-sensitive adhesive substance might be performed in order to prevent dust generation in some cases (See Japanese Patent Laid-Open No. H9-68792).

In this case, since the filter film is covered by the pressure-sensitive adhesive substance, foreign substances having adhered during manufacture of the filter member is fixed on the filter film and cannot move into the pellicle during ventilation, and dust generation from the filter member is drastically lowered. An application amount of the pressure-sensitive adhesive substance is determined considering ventilation characteristics of the filter film, but a dust-generation prevention effect and ventilation characteristic have a contradicting relationship. That is, the larger the application amount is, the better the dust-generation prevention effect, but the ventilation characteristics are deteriorated. Thus, it has been extremely difficult to ensure high ventilation capacity while a high dust-generation prevention effect is maintained.

Therefore, in order to ensure ventilation characteristics particularly in a large-sized pellicle, it is necessary to increase the number of ventilation holes for atmospheric pressure control and to accordingly increase the number of installed filter members. However, if the number of installed filter members is increased, various problems occur such as a burden of an installation work or the like.

The filter member 56 is usually installed on the outer surface of the pellicle frame 51 so as to cover the ventilation hole 52 as shown in FIG. 5B. A pellicle film 54 is attached on an upper end face of a pellicle frame 51 via a film adhesive layer 53 and a mask pressure-sensitive adhesive layer 55 is disposed at a lower end of the pellicle frame 51. FIG. 5A is a front view and FIG. 5B is a sectional view by I-I line of a prior-art pellicle.

If a large number of filter members protrude outside the pellicle frame, a risk is considerably increased that the filter member might touch a handling jig, a pellicle attaching device or an exposing device and is damaged or the pellicle frame is pushed inward for a thickness of the filter member and this causes a wrinkle in the pellicle film.

Moreover, there is a problem in manufacture. The filter member needs to be installed with tweezers or the like by well aligning the position so as not to block the ventilation hole. However, since the filter member is usually as thin as approximately 0.15 to 0.3 mm, the member should be attached with utmost care so that the film surface is not stained or damaged, and the work is extremely difficult. Therefore, if the number of members to be attached is large, the filter member attachment work has a particularly big burden on workers.

SUMMARY OF THE INVENTION

The present invention was made in view of the above problems and has an object to provide a pellicle which has less dust generation and excellent ventilation characteristics and moreover, which has no risk of contact with or breakage of the filter member while the pellicle is handled and is also excellent in workability during manufacture.

The present invention relates to A pellicle comprising: a rectangular pellicle frame formed of four side bars, having a through hole made through at least one of said frame bars for adjusting a pressure of a space formed within the pellicle frame equal to a pressure outside the pellicle frame; and a filter member disposed to cover up an external opening of the through hole for preventing entrance of particles into said space, wherein said through hole is formed with: (1) an outer stepped portion defining a first recess, opening outside the pellicle frame, for accommodating the filter member, (2) an inner stepped portion defining a second recess, opening in a bottom of said first recess, and (3) a ventilation hole with one end opening in a bottom of the second recess of the inner stepped portion and the other end opening in the space within the pellicle frame (claim 1).

The filter member in the present invention refers to a member provided with a filter for preventing particles from entering into a through hole and includes an adhesive layer or a pressure-sensitive adhesive layer for bonding the member to the outer stepped portion. A gap under the filter surface can be increased by presence of the inner stepped portion, which improves ventilation characteristics. Also, since the filter member is accommodated in the outer stepped portion, the filter member is prevented from protruding from the pellicle frame outer face or a degree of protrusion is lowered, and a fear of contact and breakage of the filter member during pellicle handling is extremely lowered.

Moreover, since the outer stepped portion also makes a target of an attachment position when the filter member is attached, accurate attachment to the position is made possible even without a special technique.

A depth of the outer stepped portion here is preferably within a range of 50 to 150% of the thickness of the filter member (claim 2). The filter member thickness includes a thickness of the adhesive layer or pressure-sensitive adhesive layer for bonding the filter member to a bottom portion of the outer stepped portion. If the depth of the outer stepped portion is at least 50% of the filter member thickness, a risk of breakage of the filter member can be somewhat lowered, and a positioning effect at attachment can be also obtained. However, if the depth is too large for the filter member thickness, attaching workability is considerably lowered, and the upper limit is preferably set at 150%.

Also, an area of the opening communicating the first recess with the second recess is 80 to 150% of that area of the filter member across which air can pass, and a depth of the inner stepped portion is 0.2 mm or more and 1 mm or less (claim 3). This range is preferable as a gap under the filter surface. The area of the filter member across which air can pass is hereinafter referred to as "filter ventilation area" and in the case of a filter member in which a pressure-sensitive adhesive layer for bonding to the pellicle frame is arranged in the filter in a ring shape, for example, an area surrounded by the ring-shaped pressure-sensitive adhesive layer is the ventilation area.

In addition to the above, by coating or soaking at least part of the filter member with an adhesive having a life-long stickness (claim 4), dust generation from the filter member can be extremely reduced while ventilation characteristics are ensured. Since the gap under the filter surface can be increased by presence of the inner stepped portion, when the pressure-sensitive adhesive substance is applied or made to infiltrate the same from outside the filter, the pressure-sensitive adhesive substance exuding into the inside of the filter is prevented from being collected on the ventilation surface of the filter or the ventilation surface is prevented from being attached to the inner face of the through hole, and desired ventilation performances can be obtained.

According to the present invention, since the maximum filter ventilation area is ensured by provision of the inner stepped portion, the number of ventilation holes can be reduced or the diameter of the ventilation hole can be made small. As a result, deterioration of the rigidity of the pellicle frame caused by provision of the through hole can be minimized. Also, if the pressure-sensitive adhesive substance is applied to the filter or made to infiltrate the same in order to reduce dust generation, the ventilation characteristics are ensured by presence of the inner stepped portion, and a pellicle with high ventilation characteristics can be obtained. Also, since the filter member is attached inside the outer stepped portion, there is no or little protrusion from the pellicle frame surface, contact and breakage of the filter member during pellicle attachment or use are reduced, which results in a pellicle with high reliability. Moreover, in manufacture, since the filter member can be positioned easily, workability is drastically improved, and even if a large number of filter members are to be installed, a work can be performed in a short time with high reliability.

BRIEF DESCRIPTION OF THE DRAWINGS

FIG. 4A is a plan view, FIG. 4B is a front view, and FIG. 4C is a bottom view of an example of a filter member.

DETAILED DESCRIPTION OF THE INVENTION

An embodiment of the present invention will be described below, but the present invention is not limited to that. Also, the present invention is particularly effective in a large-sized pellicle having a length of one side exceeding 500 mm used in an application of manufacture of a liquid crystal with a large number of through holes, but since the desired effect can be also obtained if the present invention is applied to a smallsized pellicle having the number of through holes at 1 or 2 used in the semiconductor application, the applications are not particularly limited.

In a pellicle frame, a through hole is disposed. The through hole includes an outer stepped portion, an inner stepped portion slightly smaller than the outer stepped portion, and a ventilation hole, and the outer stepped portion is slightly larger than a filter member and attached so that the filter member is accommodated in the outer stepped portion.

Since there is no or little protrusion of the filter member to the pellicle frame surface, a risk of contact with that and separation and drop during pellicle handling is considerably reduced. Also, the filter is usually attached using tweezers or the like, and since the outer stepped portion makes a target of attachment, positioning is extremely easy and workability is considerably improved. If there is no outer stepped portion, the position needs to be adjusted so that the center of the filter ventilation surface, which is invisible from the outside of the filter, is located immediately above ventilation hole, which was extremely difficult to work.

The depth of the outer stepped portion to which the filter member is to be attached is preferably within a range of 50 to 150% of the thickness of the filter member or more preferably 100 to 120%. If it is less than 100%, the filter member protrudes and a risk of breakage of the filter member cannot be fully avoided, but there is an effect that positioning in manufacture is easy. The depth of the outer stepped portion exceeding 150% of the thickness of the filter member is an excess, washing performance is deteriorated, and workability is lowered in the attachment work of the filter member, which is not preferable.

Since the gap under the filter ventilation surface is fully ensured by the inner stepped portion, ventilation characteristics of the filter member is improved. Particularly, if the pressure-sensitive adhesive substance is applied to the filter film or made to infiltrate the same, a great effect is exerted.

Figure 6:
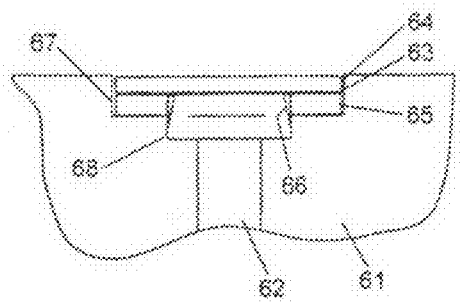
FIG. 6 is an explanatory diagram if a pressure-sensitive adhesive substance is applied or made to infiltrate the same.

A state of the pressure-sensitive adhesive substance when the pressure-sensitive adhesive substance is applied to the filter or made to infiltrate the same is shown in FIG. 6. Namely, FIG. 6 is an explanatory diagram if a pressure-sensitive adhesive substance is applied or made to infiltrate the same. An pressure-sensitive adhesive substance 66 exuding to the inside of a filter film 63 attached to an outer stepped portion 67 is coagulated by a surface tension to side walls of an adhesive layer 65 and an inner stepped portion 68. As a result, the adhesive substance is prevented from being collected on the ventilation surface of the filter film 63 or the ventilation surface is prevented from being attached to a pellicle frame 61, the ventilation area of the filter film 63 is rarely reduced. Therefore, deterioration of the ventilation characteristics by the pressure-sensitive adhesive substance can be minimized. FIG. 6 shows the case using the filter film, but the same state arises in the case of a filter in a shape other than the film. A protective mesh 64 may be provided for protecting the filter film 63. One end of a ventilation hole 62 is opened in a bottom face of the inner stepped portion 68 and the other end thereof is opened to the inside of the pellicle.

Since an influence of the ventilation hole on the ventilation characteristics is extremely smaller than that of the filter, the shape is determined mainly considering an influence on pellicle frame rigidity and workability. In the present invention, the shape of the ventilation hole does not particularly matter, but a circular hole is optimal in terms of workability. The larger the diameter is, the easier the work becomes, but as the diameter gets large, the pellicle frame rigidity is lowered, and the diameter is preferably as small as possible while the ventilation characteristics are ensured. In terms of ventilation characteristics, the diameter of approximately 0.5 mm is enough, but in the case of a particularly large-sized pellicle with a pellicle frame width exceeding 10 mm, a blade with a small diameter might be broken or a working speed might be extremely slowed. Thus, a diameter of approximately 1.5 mm is suitable in terms of a drilling work with high production efficiency.

Instead of the inner stepped portion, by making a diameter of the ventilation hole extremely large or by making the sectional shape the same as the ventilation surface of the filter, for example, an effect similar to the present invention can be obtained. However, with these methods, as mentioned above, the pellicle frame rigidity is extremely lowered due to decrease in the pellicle frame sectional area, and the pellicle cannot stand use. With the method of the present invention, the decrease in the pellicle frame sectional area can be minimized, and there is little bad influence on the pellicle frame rigidity.

An area of an opening portion on the outer stepped portion side of the inner stepped portion is preferably within a range of 80 to 150% of the ventilation area of the filter in the filter member and the depth of the inner stepped portion is preferably 0.2 mm or more and 1 mm or less. If it is less than 80%, the filter ventilation surface cannot be fully ensured, while if it is more than 150%, an adhesive portion in the pressure-sensitive adhesive layer gets smaller and attachment reliability is lowered. Also, if the depth of the inner stepped portion is less than 0.2 mm, contact with the filter surface is not fully solved, while if it is more than 1 mm, washing performances are deteriorated and moreover, a foreign-substance inspection in the stepped portion becomes hard to be performed, which is not preferable.

Also, the shape of the inner stepped portion may be designed as appropriate considering workability, washing performances and the like as well as the above range. In addition to the shapes shown in FIGS. 1A to 3B, which will be described later, a shape in which one or more steps are provided on the wall face of the inner stepped portion can be employed.

Figure 1A:
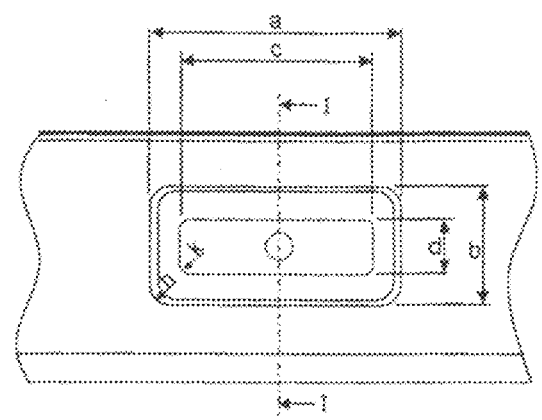
FIG. 1A is a front view and FIG. 1B is a sectional view by I-I line of an essential part of a first embodiment of a pellicle of the present invention.
Figure 1B:
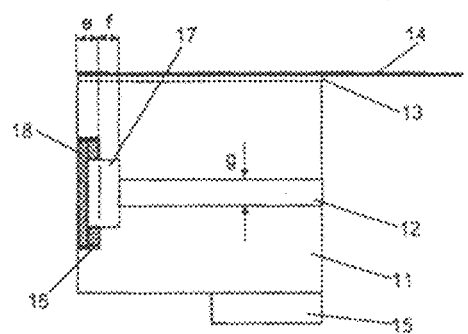

FIG. 1A is a front view and FIG. 1B is a sectional view by I-I line of an essential part of a first embodiment of a pellicle of the present invention. FIGS. 1A and 1B show a partial view around a filter member 18 attached portion, and the filter member 18 has a structure as shown in FIG. 4B, in which a pressure-sensitive adhesive layer 43 is bonded to one face of a filter film 41 made of porous PTFE or the like and a mesh made of coarse PP or the like is bonded to the other face as a protective mesh 42. FIG. 4A is a plan view, FIG. 4B is a front view, and FIG. 4C is a bottom view of an example of a filter member. A region in the center part of the pressure-sensitive adhesive layer 43 is hollowed out and the filter film 41 is exposed to this portion and thus, ventilation is performed in this region. The inner stepped portion 17 has a corner part on the bottom cut out at a right angle. A shape in the plane direction of the opening portion on the outer stepped portion 16 side of the inner stepped portion is made to comply with the exposed shape of the filter member.

A filter member 18 is installed on the outer surface of a pellicle frame 11 so as to cover a ventilation hole 12 as shown in FIG. 1B. A pellicle film 14 is attached on an upper end face of the pellicle frame 11 via a film adhesive layer 13 and a mask pressure-sensitive adhesive layer 15 is disposed at a lower end of the pellicle frame 11.

Figure 2A:
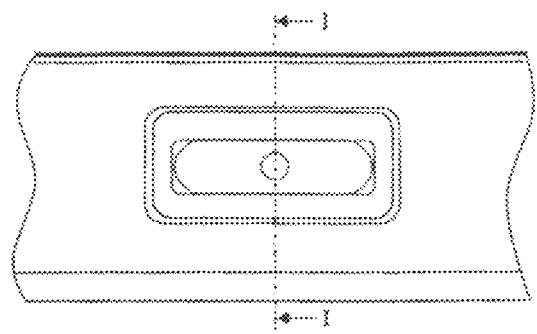
FIG. 2A is a front view and FIG. 2B is a sectional view by I-I line of an essential part of a second embodiment of a pellicle of the present invention.
Figure 2B:
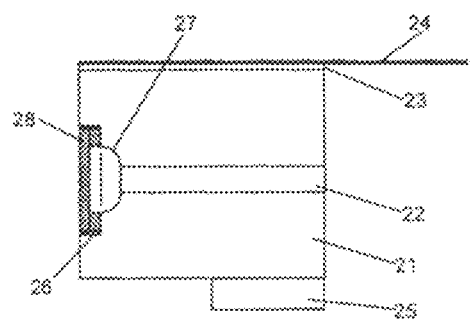

FIG. 2A is a front view and FIG. 2B is a sectional view by I-I line of an essential part of a second embodiment of a pellicle of the present invention. An outer broken line in FIG. 2A indicates an inner circumferential face of the adhesive layer of the filter film and an inner broken line indicates a shape of the opening portion of an inner stepped portion 27. In this embodiment, the corner part on the bottom of the inner stepped portion 27 is spherically curved and the shape in the plane direction of the opening portion on the outer stepped portion 26 side of the inner stepped portion is made with chamfered corners, which is easy to be worked.

A filter member 28 is installed on the outer surface of a pellicle frame 21 so as to cover a ventilation hole 22 as shown in FIG. 2B. A pellicle film 24 is attached on an upper end face of the pellicle frame 21 via a film adhesive layer 23 and a mask pressure-sensitive adhesive layer 25 is disposed at a lower end of the pellicle frame 21.

Figure 3A:
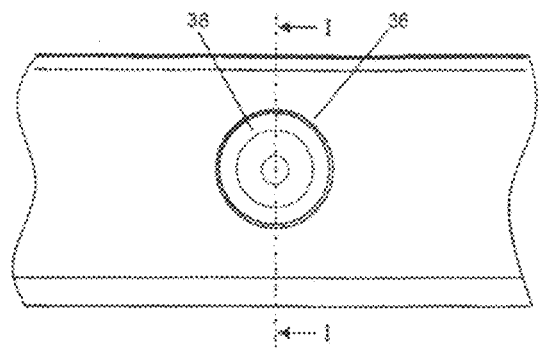
FIG. 3A is a front view and FIG. 3B is a sectional view by I-I line of an essential part of a third embodiment of a pellicle of the present invention.
Figure 3B:
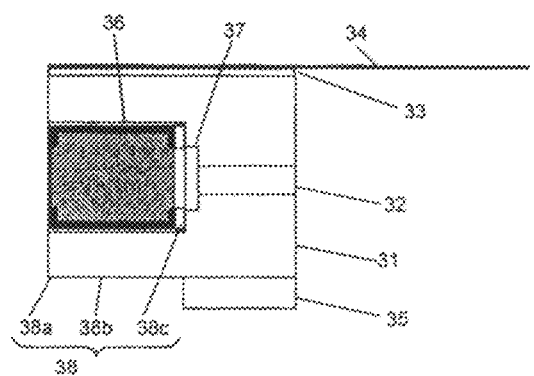

FIG. 3A is a front view and FIG. 3B is a sectional view by I-I line of an essential part of a third embodiment of a pellicle of the present invention. The cases using a filter member provided with a single-layer filter film as shown in FIG. 4B have been described, but a cylindrical filter member 38 so as to cover a ventilation hole 32 as shown in FIGS. 3A and 3B can be also used. This cylindrical filter member 38 is formed by attaching a filter 38a (hatched in FIG. 3B) made of a sintered metal porous body, porous ceramics, stainless steel wire, porous resin and the like into an outer cylinder 38b made of stainless steel, polypropylene and the like by crimping or bonding and moreover by providing a pressure-sensitive adhesive layer 38c for fixing it to a pellicle frame 31, and ventilation is performed between both end faces of the cylinder. The pellicle without a protective mesh is shown in FIG. 3B, but the protective mesh may be provided. A layer of an adhesive may be provided instead of the pressure-sensitive adhesive layer 38c. In this case, too, if another recess of the inner stepped portion 37 is provided inside the recess of the outer stepped portion 36 in which the filter member is accommodated, the same effect as in the case of the filter member with the single-layer film can be obtained. A gap portion between the outer cylinder 38b and the outer stepped portion 36 is preferably filled with an adhesive substance such as epoxy, a silicone resin and the like.

A pellicle film 34 is attached on an upper end face of the pellicle frame 31 via a film adhesive layer 33 and a mask pressure-sensitive adhesive layer 35 is disposed at a lower end of the pellicle frame 31.

EXAMPLES

Examples of the present invention will be described below, but the present invention is not limited to them.

Example 1

Figure 7A:
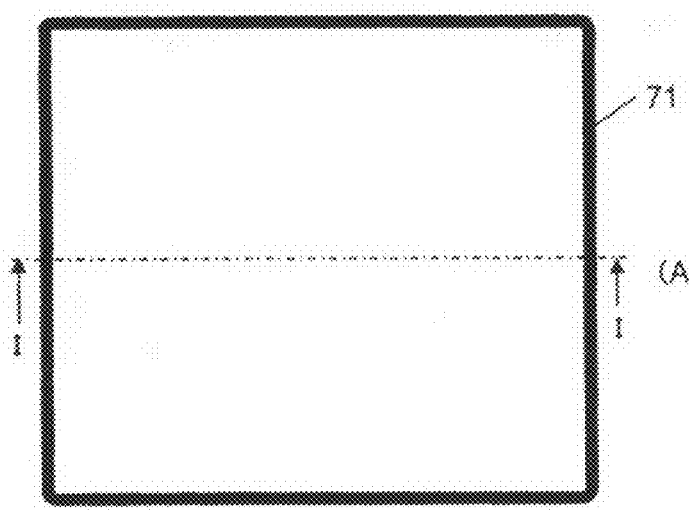
FIG. 7A is a plan view and FIG. 7B is a sectional view by I-I line of a pellicle frame.
Figure 7B:

From a rolled plate made of A5052 aluminum alloy, a pellicle frame with an outer dimension of 1526×1748 mm, an inner dimension of 1493×1711 mm, and a height of 6.2 mm and a shape as shown in FIG. 7A was manufactured by machine work. FIG. 7A is a plan view and FIG. 7B is a sectional view by I-I line of a pellicle frame 71. In this pellicle frame, 16 ventilation holes were disposed so that each ventilation hole might have a sectional shape as shown in FIG. 1B. Here, the dimensions in the figure are the outer stepped portion (a, b, e)=10.0×4.0×0.3 mm, the inner stepped portion (c, d, f)=7.5×1.6×0.5 mm, the ventilation hole diameter (g)=1.5 mm, a radius of curvature (h) of an outer edge corner part of the outer stepped portion=1.0 mm, and a radius of curvature (k) of an outer edge corner part of the inner stepped portion=0.5 mm. Then, after the machine work is finished, the pellicle frame surface was sandblast-treated, and further applied with black anodization treatment.

This pellicle frame was transported into a clean room of Class 10, washed with a surfactant and purified water and completely dried.

To an upper end face of this pellicle frame, a silicone pressure-sensitive adhesive (product name: KR3700 by Shin-Etsu Chemical Co., Ltd.) diluted by toluene as a pellicle film adhesive layer 13 was applied so as to have a dry film thickness of approximately 100 μm. Also, to a lower end face, a silicone pressure-sensitive adhesive (product name: KR3700 by Shin-Etsu Chemical Co., Ltd.) diluted by toluene as a mask pressure-sensitive adhesive for constituting a mask pressure-sensitive adhesive layer 15 was applied so as to have a 6 mm width. At this time, finishing was made so that a height of the pressure-sensitive adhesive layer after drying might be approximately 2 mm.

Then, to each ventilation hole, a filter member with a trapping diameter of 0.1 μm in a structure including a protective mesh 42, a filter film 41, and a pressure-sensitive adhesive layer 43 as shown in FIG. 4B manufactured by punching was attached using tweezers and then, 4 μl of a silicone pressure-sensitive adhesive (product name: KR3700 by Shin-Etsu Chemical Co., Ltd.) diluted by toluene to appropriate viscosity was applied from the surface of the filter member with a hand dispenser, and the filter film was infiltrated with the pressure-sensitive adhesive. Time required for the filter attachment work using the tweezers was measured and turned out to be approximately 15 sec. per filter.

After that, this pellicle frame was heated to 130° C. so as to dry the adhesive and the solvent in the adhesive and the silicone pressure-sensitive adhesive was entirely cured and then, a separator separately manufactured for protection of the adhesive was attached onto a mask pressure-sensitive adhesive layer 15. This separator was manufactured by cutting a polyethylene terephthalate (PET) film (thickness: 125 μm, translucent) having one face coated with a mold separator into a shape of the pellicle frame.

Subsequently, manufacture of the pellicle film will be described. In the Class 100 clean room, a quartz substrate of 1620×1780 mm having the surface polished smoothly was washed and dried, and then, a fluorine contained resin (product name: Cytop, by Asahi Glass Co., Ltd.) solution was applied as a film material to its one face using a die-coating method so as to have a film thickness of 6 μm after drying. As the film forming method, the die-coating method was used here, but various methods including a spin coating method, slit-and-spin method and the like can be used other than that. After that, a film formed substrate was heated in an oven to 200° C. so as to dry the solvent. Then, after cooling, a frame-shaped film peeling jig was bonded to this film so as to peel it off the substrate slowly and obtain a pellicle film.

Lastly, the pellicle film attached to the film peeling jig was bonded to the above-mentioned film adhesive layer of the pellicle frame, and the pellicle was brought to completion by cutting off an outside excess film by a cutter.

An appearance of a filter portion of the completed pellicle was observed and all the filters were contained in the steps and favorable without bending or misalignment.

Figure 8:
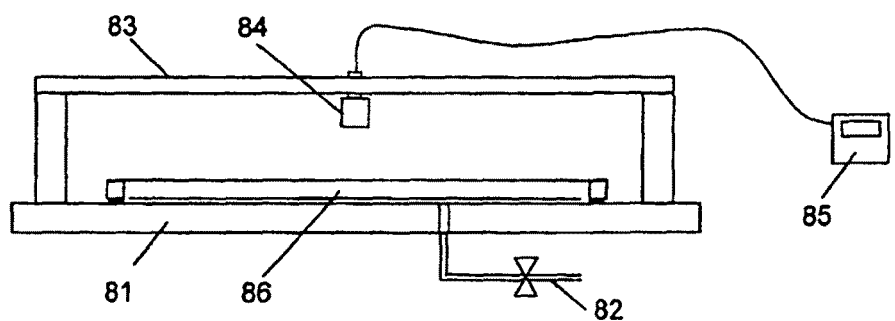
FIG. 8 shows a ventilation characteristics evaluating device.

Then, ventilation characteristics of the pellicle were evaluated. A device used for the evaluation is shown in FIG. 8. A measured pellicle 86 is bonded to an aluminum base plate 81, and a valve 82 for introducing air into the pellicle is provided. An ultrasonic distance sensor 84 is attached under a supporting frame 83 with a predetermined distance from above the base plate 81 so that a distance to the pellicle film can be measured and displayed on a display 85.

By means of this device, 5000 cc of air was introduced to the pellicle and time till the pellicle film returned to the original height was measured, and the result was 17 hr. 30 min.

Also, a dust generation amount from the filter member in this pellicle was evaluated. First, a quartz glass substrate with 1620×1780×thickness 10 mm and having the surface polished was prepared, washed and dried in the clean room and then, a foreign-substance inspection on the substrate was conducted using a light collecting lamp in a dark room. The adhering foreign substance was removed by air blow but those that could not be removed were accurately recorded on a map regarding their positions.

Figure 9:
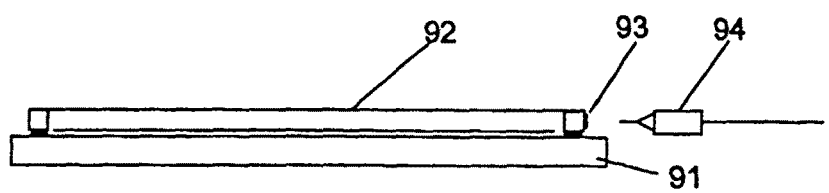
FIG. 9 is a dust-generation evaluating device.

After that, as shown in FIG. 9, a manufactured pellicle 92 was attached to this quartz glass substrate 91, and a closed space surrounded by the pellicle 92 and the glass substrate 91 was made. Then, five spots were selected at random in a filter portion 93 of the pellicle 92, and air was blown by an air gun 94 from the outside. Conditions of the air blow were a nozzle diameter: 2 mm, a distance: 20 mm, a pressure: 4 kgf/cm$^2$, and a blow time: 10 sec.

Then, after the air blow to the filter member, foreign substances on the quartz glass substrate 91 were visually inspected with a help of a spot light in the dark room and compared with the map in the inspection before the air blow. As a result, foreign substances were not increased at all, and it was confirmed that no dust was generated from the filter member.

Example 2

A pellicle was manufactured with the same method and procedure as those in Example 1. However, a silicone pressure-sensitive adhesive was not applied to the filter member to be used. For this pellicle, appearance inspection and ventilation characteristics evaluation were made similarly to Example 1.

An appearance of the filter member of the completed pellicle was observed and turned out that all the filter members were accommodated in the steps and favorable without bending or misalignment.

As the ventilation characteristics evaluation, the device in FIG. 8 introduced 5000 cc of air into the pellicle, and time till the pellicle film returned to the original height was measured, and the result was 14 hr. 40 min.

Comparative Example 1

Figure 5A:
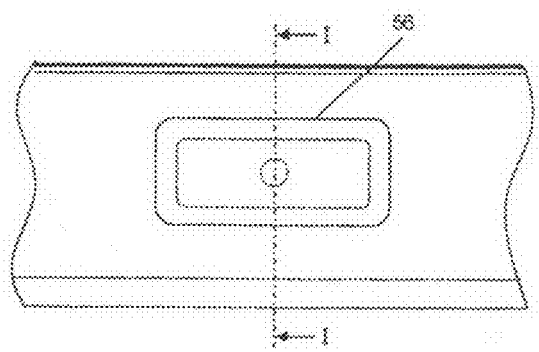
FIG. 5A is a front view and FIG. 5B is a sectional view by I-I line of a prior-art pellicle.
Figure 5B:
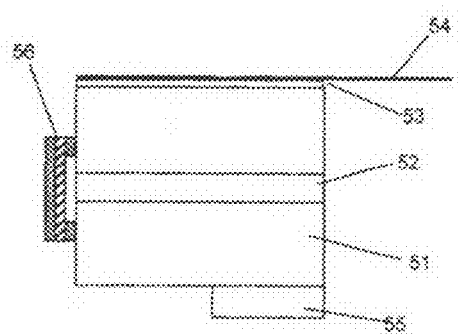

A pellicle frame with an outer dimension of 1526×1748 mm, an inner dimension of 1493×1711 mm, and a height of 6.2 mm as shown in FIG. 7A was manufactured by machine work from a rolled plate of A5052 aluminum alloy. In this pellicle frame, 16 ventilation holes 52 having the same diameter sectional shape and a diameter of 1.5 mm as shown in FIG. 5B were disposed. After the machine work was finished, the pellicle frame surface was sandblast treated and further applied with black anodization treatment.

Then, similarly to the above Example 1, this pellicle frame was washed and dried in the Class 100 clean room and then, a film adhesive 53 and a mask pressure-sensitive adhesive 55 were applied similarly to the above Example 1. Then, to each ventilation hole, a filter member in a structure as shown in FIG. 4C manufactured by punching was attached using tweezers and then, 4 μl of a silicone pressure-sensitive adhesive (product name: KR3700 by Shin-Etsu Chemical Co., Ltd.) diluted by toluene to the same viscosity as that of the above Example 1 was applied to the surface of a filter member 56 with a hand dispenser, and the filter film was infiltrated with the pressure-sensitive adhesive. At this time, time required for the filter attachment work using the tweezers was measured and turned out to be approximately 36 sec. per filter.

Then, this pellicle frame was heated to 130° C. so as to dry the solvent and the silicone pressure-sensitive adhesive was entirely cured and then, a separator separately manufactured for protection of the pressure-sensitive adhesive was attached onto the mask pressure-sensitive adhesive layer.

Lastly, the pellicle film manufactured similarly to the above Example 1 was bonded to the film adhesive layer of the pellicle frame, and the pellicle was brought to completion by cutting off an excess film outside the pellicle frame by a cutter.

For the completed pellicle, ventilation characteristics evaluation was made similarly to Example 1 using the device shown in FIG. 8. The air introduction valve 82 introduced 5000 cc of air into the sealed space of the pellicle, and time till the film returned to horizontal was measured, and the result was approximately 41 hr.

For the completed pellicle, an appearance of the filter member was observed. Misalignment and bending were found in each of the filter members, and particularly misalignment in the intervals between the filter members was conspicuous. The interval between the filter members was measured, and it was found out that the filter members were attached with the minimum interval of 78 mm and the maximum interval of 83 mm for the design interval of 80 mm. If the filter member is attached with deviation from the position it should have been located, the silicone pressure-sensitive adhesive applied to the filter member might directly flow into the ventilation hole and reduce or block the ventilation hole with the pressure-sensitive adhesive layer, and this pellicle had the concern. Also, the appearance was not favorable. Since as many as 16 filter members protruded from the pellicle frame, there was a high risk that the pellicle frame might be broken and peeled off if it touches something.

Moreover, as the evaluation of dust generation amount from the filter member, air blow was conducted to the filter members at five spots with the totally same conditions as in the above Example 1, but the foreign substances on the substrate did not increase at all and no dust generation was confirmed from the filter member.

Summarizing the above results for Comparative Example 1, no dust was generated from the filter member because of the effect of the pressure-sensitive adhesive applied on the filter film, which is preferable, but the filter-member attached state is poor in appearance, and the ventilation characteristics are extremely poor. The performances were poorer as compared with Example 1.

Comparative Example 2

A pellicle was manufactured with the same method and procedure as those of the above Comparative Example 1. However, the silicone pressure-sensitive adhesive was not applied to the filter member to be used. For this pellicle, the same evaluation as that for the above Example 1 was made.

An appearance of the filter portion of the completed pellicle was observed and a lot of bending and misalignment were found similarly to the above Comparative Example 1, and the appearance was not favorable.

As the ventilation characteristics evaluation, the device in FIG. 8 introduced 5000 cc of air into the pellicle, and time till the pellicle film returned to the original height was measured, and the result was 15 hr. 30 min.

Moreover, as the evaluation of dust generation amount from the filter member, air blow was conducted to the filter members at five spots with the totally same conditions as in the above Example 1. As a result, several foreign substances with the diameters of 5 to 30 μm were found to adhere to the glass substrate in the vicinity of the four ventilation holes in five.

Summarizing the above results, the pellicle in Comparative Example 2 was poorer than the above Example 2 in the ventilation characteristics. Also, dust generation from the filter was large, and reliability was extremely low.

The invention claimed is:

1. A pellicle, comprising:
    a rectangular pellicle frame formed of four side bars, and having a through hole made through at least one of said frame bars for adjusting a pressure of a space formed within the pellicle frame equal to a pressure outside the pellicle frame; and
    a filter member disposed to cover up an external opening of the through hole for preventing entrance of particles into said space, wherein
    said through hole comprises
    (1) an outer stepped portion defining a first recess, opening outside the pellicle frame, for accommodating the filter member,
    (2) an inner stepped portion defining a second recess, opening in a bottom of said first recess, and
    (3) a ventilation hole comprising one end opening in a bottom of the second recess of the inner stepped portion and another end opening in the space within the pellicle frame.

2. The pellicle according to claim 1, wherein a depth of the outer stepped portion is within a range of 50 to 150% of a thickness of the filter member.

3. The pellicle according to claim 1, wherein
    an area of an opening of the inner stepped portion communicating with the first recess is 80 to 150% of an area of the filter member across which air passes, and
    a depth of the inner stepped portion is 0.2 mm or more and 1 mm or less.

4. The pellicle according to claim 1, wherein at least part of said filter member is coated with or infiltrated with an adhesive having permanent stickiness.

5. The pellicle according to claim 1, wherein the inner stepped portion has a semi sphere shape having a curved bottom communicating with the ventilation hole.

6. The pellicle according to claim 1, wherein the inner stepped portion has a cuboidal shape having a flat bottom communicating with the ventilation hole.

7. The pellicle according to claim 1, wherein an opening part of the inner stepped portion in a plane direction of the outer stepped portion has a round shape.

8. The pellicle according to claim 1, wherein an opening part of the inner stepped portion in a plane direction of the outer stepped portion has a rectangular shape with chamfered corners.

9. The pellicle according to claim 1, wherein
    the filter member is a cylindrical filter comprising a filter, an outer cylinder, and an adhesive layer,
    the filter comprises one material selected from the group consisting of a sintered metal porous body, porous ceramics, a stainless steel wire, and porous resin,
    the outer cylinder comprises stainless steel or polypropylene,
    the filter is fixed in the outer cylinder, and
    the filter member is fixed on the pellicle frame with the adhesive layer.

10. The pellicle according to claim 9, wherein a gap between the outer cylinder and a surface of the outer stepped portion is filled with resin.

11. The pellicle according to claim 1, wherein
    the filter member comprises a pressure-sensitive adhesive layer, a filter film, and a protective mesh,
    the pressure-sensitive adhesive is present on a side of the filter film, and
    the protective film is present on another side of the filter film.

* * * * *